United States Patent
Salowe et al.

(10) Patent No.: US 7,089,526 B1
(45) Date of Patent: Aug. 8, 2006

(54) MAXIMUM FLOW ANALYSIS FOR ELECTRONIC CIRCUIT DESIGN

(75) Inventors: Jeffrey Scott Salowe, Cupertino, CA (US); Steven Lee Pucci, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 192 days.

(21) Appl. No.: 10/342,828

(22) Filed: Jan. 14, 2003

(51) Int. Cl.
*G06F 17/50* (2006.01)

(52) U.S. Cl. .............................. 716/14; 716/7

(58) Field of Classification Search .................... 716/7, 716/13, 14
See application file for complete search history.

(56) References Cited

U.S. PATENT DOCUMENTS

| | | | |
|---|---|---|---|
| 5,157,618 A | 10/1992 | Ravindra et al. | |
| 5,911,061 A | 6/1999 | Tochio et al. | |
| 6,075,933 A * | 6/2000 | Pavisic et al. | 716/9 |
| 6,219,823 B1 * | 4/2001 | Hama et al. | 716/12 |
| 6,230,306 B1 * | 5/2001 | Raspopovic et al. | 716/13 |
| 6,253,363 B1 | 6/2001 | Gasanov et al. | |
| 6,289,495 B1 * | 9/2001 | Raspopovic et al. | 716/12 |
| 6,324,675 B1 * | 11/2001 | Dutta et al. | 716/13 |
| 6,349,403 B1 | 2/2002 | Dutta et al. | |
| 6,625,611 B1 | 9/2003 | Teig et al. | |
| 6,668,365 B1 * | 12/2003 | Harn | 716/10 |
| 6,701,306 B1 | 3/2004 | Kronmiller et al. | |
| 6,785,874 B1 | 8/2004 | Tsukuda | |
| 6,845,495 B1 * | 1/2005 | Andreev et al. | 716/14 |
| 6,857,115 B1 * | 2/2005 | Dasasathyan et al. | 716/9 |
| 2002/0059194 A1 | 5/2002 | Choi et al. | |
| 2003/0066045 A1 * | 4/2003 | Teig et al. | 716/14 |
| 2004/0044980 A1 | 3/2004 | Tsukuda | |

OTHER PUBLICATIONS

Hu, Jiang et al., "A survey on multi-net global routing for integrated circuits", http://www.ece.umn.edu/users/sachin/PUBS/integration01.pdf, 1998, pp. 1-68.*

Sarker, Probir, et al., "Routability-driven repeater block planning interconnect-centric floorplanning", Apr. 2000, IEEE, International Symposium on Physical Design archive Proceedings of the 2000 international symposium on Physical design. pp. 186-191.*

Brenner, Ulrich, et al., "An effective congestion driven placement framework", 2002, ACM Press, International Symposium on Physical Design archive Proceedings of the 2002 international symposium on Physical design. pp. 6-11.*

(Continued)

*Primary Examiner*—Stacy A. Whitmore
(74) *Attorney, Agent, or Firm*—Bingham McCutchen LLP

(57) ABSTRACT

Disclosed are improved methods and mechanisms for congestion and maximum flow analysis for routing an integrated circuit design. In one approach, maximum flow analysis is performed by tessellating a portion of a layout to form space tiles, which are used to interpret a flow graph. The flow graph comprises a set of vertices and edges. The capacity of edges in the flow graph is used to identify the maximum flow for that portion of the layout. In another approach, an edge walk is performed against a set of space tiles, in which a nearest neighbor determination is determined for each edge to perform maximum flow analysis.

24 Claims, 15 Drawing Sheets

OTHER PUBLICATIONS

Dinitz, Y., et al,. On the single-source unsplittable flow problem, IEEE, Nov. 1998, pp. 290-299.*

Ahuja, R.K. et al., eds., *Network Flows. Theory, Algorithms, and Applications* (1993) pp. 510-542, Prentice Hall, Upper Saddle River, NJ.

Al-Yamani, A. et al. "HPTS: Heterogeneous Parallel Tabu Search for VLSI Placement" *Proceedings of the 2002 Congress on Evolutionary Computation* (May 12-17, 2002). 1:351-355.

Anderson, R. et al. "An O(n log n) Algorithm for 1-D Tile Compaction" *ICCAD-89—International Conference on Computer-Aided Design* (Nov. 5-9, 1989) pp. 144-147.

Balasa, F. et al. "Efficient Solution Space Exploration Based on Segment Trees in Analog Placement with Symmetry Constraints" in *IEEE/ACM International Conference on Computer Aided Design* (Nov. 10-14, 2002) pp. 497-502.

Barzaghi, M. et al. "Hierarchical Management of VLSI Cells at Different Description Levels" *Proceedings of the 6th Mediterranean Electrotechnical Conference* (May 22-24, 1991) 1:327-330.

Benetis, R. et al. "Nearest Neighbor and Reverse Nearest Neighbor Queries for Moving Objects" *Proceedings of the International Database Engineering and Applications Symposium (IDEAS'02)* (Jul. 17-19, 2002) pp. 44-53.

Bern, J. et al. "Some Heuristics for Generating Tree-like FBDD Types" *IEEE Transactions on Computer-Aided Design of Integrated Circuits and Systems* (Jan. 1996) 15(1):127-130.

Bhattacharya, S. and W.-T. Tsai "Area Efficient Binary Tree Layout" *1st Great Lakes Symposium on VLSI* (Mar. 1-2, 1991) pp. 18-24.

Blust, G. and D.P. Mehta "Corner Stitching for L-shaped Tiles" *Proceedings of the 3rd Great Lakes Symposium on VLSI, Design Automation of High Performance VLSI Systems* (Mar. 5-6, 1993) pp. 67-68.

Borah, M. et al. "An Edge-Based Heuristic for Steiner Routing" *IEEE Transactions on Computer-Aided Design of Integrated Circuits and Systems* (Dec. 1994) 13(12):1563-1568.

Brück, R. and H. Wronn "—geoADDICTION—Flexible Handling of Geometries in IC-Layout Tools" *ISCAS '88—IEEE International Symposium on Circuits and Systems* (Jun. 7-9, 1988) 1:723-726.

Cadence Design Systems, Inc. *IC Shape-Based Technology Chip Assembly User Guide* Product Version 11.0 (Nov. 2001).

Carlson, E.C. and R.A. Rutenbar "A Scanline Data Structure Processor for VLSI Geometry Checking" *IEEE Transactions on Computer-Aided Design* (Sep. 1987) 6(5):780-794.

Cheung, P. and J. Hesketh "Design Automation Tools for Tile-Based Analogue Cells" *IEE Colloquium on New Directions in VLSI Design* (Nov. 27, 1989) pp. 3/1-3/5.

Chiang, C. and C.-S. Chiang "Octilinear Steiner Tree Construction" *MWSCAS-2002—The 2002 45th Midwest Symposium on Circuits and Systems* (Aug. 4-7, 2002) 1:603-606.

Christian, B.S. et al. "A VLSI Interval Router for High-Speed Networks" *Canadian Conference on Electrical and Computer Engineering* (May 26-29, 1996) 1:154-157.

Cong, J. et al. "Multilevel Approach to Full-Chip Gridless Routing" *ICCAD 2001—IEEE/ACM International Conference on Computer-Aided Design* (Nov. 4-8, 2001) pp. 396-403.

Curatelli, F. et al. "Efficient Management of Complex Elements in Physical IC Design" *Proceedings of the IEEE International Symposium on Circuits and Systems* (May 1-3, 1990) 1:456-459.

Das, S. and B.B. Bhattacharya "Channel Routing in Manhattan-Diagonal Model" *Proceedings of the 9th International Conference on VLSI Design* (Jan. 3-6, 1996) pp. 43-48.

Dasgupta, P. et al. "Multiobjective Search in VLSI Design" *Proceedings of the 7th International Conference on VLSI Design* (Jan. 1994) pp. 395-400.

Dasgupta, P. et al. "Searching Networks With Unrestricted Edge Costs" *IEEE Transactions on Systems, Man and Cybernetics-Part A: Systems and Humans* (Nov. 2001) 31(6):497-507.

Dijkstra, E.W. "A Note on Two Problems in Connexion with Graphs" *Numerische Mathematik* (1959) 1:269-271 de Dood, P. et al. "A Two-Dimensional Topological Compator With Octagonal Geometry" *28th ACM/IEEE Automation Conference* (1991) pp. 727-731.

Doong, K. Y.-Y. et al. "Infrastructure Development and Integration of Electrical-Based Dimensional Process Window Checking" *IEEE Transactions on Semiconductor Manufacturing* (May 2004) 17(2):123-141.

Dutt, S. "New Faster Kernighan-Lin-Type Graph-Partitioning Algorithms" *ICCAD-93—IEEE/ACM International Conference on Computer-Aided Design* (Nov. 7-11, 1993) pp. 370-377.

Façanha, H.S. et al. "Layout Tool for High Speed Electronic and Optical Circuits" *IEE Colloquium on Analogue IC Design: Obstacles and Opportunities* (Jun. 18, 1990) pp. 3/1-3/5.

Façanha, H.S. et al. "Data structures for physical representation of VLSI" *Software Engineering Journal* (Nov. 1990) 5(6):339-349.

Fang, J.P. and S.J. Chen "Tile-Graph-Based Power Planning" *ISCAS'03—Proceedings of the 2003 International Symposium on Circuits and Systems* (May 25-28, 2003) 5:V-501 - V-504.

Faroe, O. et al. "Local Search for Final Placement in VLSI Design" *ICCAD 2001—IEEE/ACM International Conference on Computer-Aided Design* (Nov. 4-8, 2001) pp. 565-572.

Gannett, J.W. "Shortfinder: A Graphical CAD Tool for Locating Net-to-Net Shorts in VLSI Chip Layouts" *IEEE Transactions on Computer-Aided Design* (Jun. 1990) 9(6):669-674.

Grgek, M. et al. "Performance Comparison of Several Data Structures for Storing VLSI Geometry" *The IEEE Region 8 EUROCON 2003, Computer as a Tool* (Sep. 22-24, 2003) 1:156-159.

Guibas, L.J. and J. Stolfi "On Computing All North-East Nearest Neighbors in the $L_1$ Metric" *Information Processing Letters* (Nov. 8, 1983) 17:219-223.

Hettiaratchi, S. and P.Y.K. Cheung "A novel implementation of tile-based address mapping" *Date'04—Proceedings of the Design, Automation and Test in Europe Conference and Exhibition* (Feb. 16-20, 2004) 1:306-310.

Hsiao, P.-Y. and W.-S. Feng "Using a Multiple Storage Quad Tree on a Hierarchical VLSI Compaction Scheme" *IEEE Transactions on Computer-Aided Design* (May 1990) 9(5):522-536.

Hsiao, P.-Y. et al. "Optimal tile partition for space region of integrated circuits geometry" *IEEE Proceedings-E* (May, 1993) 140(3):145-153.

Hur, S.-W. and J. Lillas "Relaxation and Clustering in a Local Search Framework: Application to Linear Placement"

*Proceedings of the 36h Design Automation Conference* (Jun. 21-25, 1999) pp. 360-366.

Hwang, F.K. "An O(n log n) Algorithm for Rectilinear Minimal Spanning Trees" *J ACM* (Apr. 1979) 26(2):177-182.

Iwasaki, H. et al. "An Effective Data Structure for VLSI Layout Systems" *Proceedings of the IEEE International Symposium on Circuits and Systems* (Jun. 11-14, 1991) 5:3134-3137.

Johann, M. and R. Reis "Net by Net Routing with a New Path Search Algorithm" *Proceedings of the 13th Symposium on Integrated Circuits and Systems Design* (Sep. 18-24, 2000) pp. 144-149.

Kiyota, K. and K. Fujiyoshi "Simulated Annealing Search Through General Structure Floorplans Using Sequence-Pair" *Iscas 2000—Proceedings of the 2000 IEEE International Symposium on Circuits and Systems*, Geneva, Switzerland (May 28-31, 2000) 3:77-80.

Koh, C.-K. and P.H. Madden "Manhattan or Non-Manhattan? A Study of Alternative VLSI Routing Architectures" *Proceedings of the 10th Great Lakes Symposium on VLSI* (Mar. 2000) pp. 47-52.

Kruskal, Jr., J.B. "On the Shortest Spanning Subtree of a Graph and the Traveling Salesman Problem" *Proc. Amer. Math. Soc.* (1956) pp. 48-50.

Ku, L.-P. and H.W. Leong "Note on optimal tile partition for space region of integrated-circuit geometry" *IEE Proceedings on Computers and Digital Techniques* (Jul. 1996) 143(4):246-248.

Kubo, Y. et al. "Self-Reforming Routing for Stochastic Search in VLSI Interconnection Layout" *Proceedings of the ASP-DAC 2000 Asia South Pacific Design Automation Conference* (Jan. 25-28, 2000) pp. 87-92.

Kuh, E.S. and T. Ohtsuki "Recent Advances in VLSI Layout" *Proceedings of the IEEE* (Feb. 1990) 78(2):237-263.

Kunii, T.L. et al. "Hierarchic Shape Description via Singularity and Multiscaling" *COMPSAC 94—Proceedings of the 18th Annual International Computer Software and Applications Conference* (Nov. 9-11, 1994) pp. 242-251.

Lai, G.G. et al. "Hinted Quad Trees for VLSI Geometry DRC Based on Efficient Searching for Neighbors" *IEEE Transactions on Computer-Aided Design of Integrated Circuits and Systems* (Mar. 1996) 15(3):317-324.

Lai, Y.-K. et al. "An Efficient Array Architecture with Data-Rings for 3-Step Hierarchical Search Block Matching Algorithm" *1997 IEEE International Symposium on Circuits and Systems*, Hong Kong (Jun. 9-12, 1997) 2:1361-1364.

Liao, S. et al. "An Efficient External-Memory Implementation of Region Query with Application to Area Routing" *(ICCD'02)—Proceedings of the 2002 IEEE International Conference on Computer Design: VLSI in Computers and Processors* (Sep. 16-18, 2002) pp. 36-41.

Lin, Y.-L. et al. "Routing Using a Pyramid Data Structure" *ICCAD-89—1989 International Conference on Computer-Aided Design* (Nov. 5-9, 1989) pp. 436-439.

Lin, Y.-L. et al. "Hybrid Routing" *IEEE Transactions on Computer-Aided Design* (Feb. 1990) 9(2):151-157.

Linhares, A. "Synthesizing a Predatory Search Strategy for VLSI Layouts" *IEEE Transactions on Evolutionary Computation* (Jul. 1999) 3(2):147-152.

Lodha, S.K. and D. Bhatia "Bipartitioning Circuits using TABU Search" *Proceedings of the 11th Annual IEEE International ASIC Conference* (Sep. 13-16, 1998) pp. 223-227.

Luk, W.K. and A.A. Dean "Multistack Optimization for Data-Path Chip Layout" *IEEE Transactions on Computer-Aided Design* (Jan. 1991) 10(1):116-129.

Margarino, A. et al. "A Tile-Expansion Router" *IEEE Transactions on Computer-Aided Design* (Jul. 1987) 6(4):507-517.

Marple, D. et al. "Tailor: A Layout System Based on Trapezoidal Corner Stitching" *IEEE Transactions on Computer-Aided Design* (Jan. 1990) 9(1):66-90.

Mehta, D. and G. Blust "Corner Stiching for Simple Rectilinear Shapes" *IEEE Transactions on Computer-Aided Design of Integrated Circuits and Systems* (Feb. 1997) 16(2):186-198.

van der Meijs, N.P. and A.J. van Genderen "Space-Efficient Extraction Algorithms" *Proceedings of the 3rd European Conference on Design Automation* (Mar. 16-19, 1992) pp. 520-524.

van der Meijs, N.A. and A.J. van Genderen "An Efficient Algorithm for Analysis of Non-Orthogonal Layout" *ISCAS '89—IEEE International Symposium on Circuits and Systems* (May 8-11, 1989) 1:47-52.

Modarres, H. and R.J. Lomax "A Formal Approach to Design-Rule Checking" *IEEE Transactions on Computer-Aided Design* (Jul. 1987) 6(4):561-573.

Nakatake, S. et al. "Consistent Floorplanning with Hierarchical Superconstraints" *IEEE Transactions on Computer-Aided Design of Integrated Circuits and Systems* (Jan. 2002) 21(1):42-49.

Öten, R. and R. J.P. de Figueiredo "Topological Dimensionality Determination and Dimensionality Reduction Based on Minimum Spanning Trees" *ISCAS '98—Proceedings of the 1998 IEEE International Symposium on Circuits and Systems* (May 31-Jun. 3, 1998) 3:366-369.

Pitaksanonkul, A. et al. "Comparisons of Quad Trees and 4-D Trees: New Results" *IEEE Transactions on Computer-Aided Design* (Nov. 1989) 8(11):1157-1164.

Powers, K.D. et al. "The 60* Grid: Routing Channels in Width d/β" *Proceedings of the 1st Great Lakes Symposium on VLSI* (Mar. 1-2, 1991) pp. 214-219.

Preparata, F.P. and M.I. Shamos, *Computational Geometry An Introduction* (1985) Springer-Verlag New York Inc.

Prim, R.C. "Shortest Connection Networks and Some Generalizations" *The Bell System Technical Journal* (Nov. 1957) 36(6):1389-1401.

Rothermel, H.-J. and D.A. Mlynski "Automatic Variable-Width Routing for VLSI" *IEEE Transactions on Computer-Aided Design* (Oct. 1983) 2(4):271-284.

Sait, S.M. et al. "Performance and Low Power Driven VLSI Standard Cell Placement using Tabu Search" *CED '02—Proceedings of the 2002 Congress on Evolutionary Computation* (May 12-17, 2002) 1:372-377.

Sakanushi, K. and Y. Kajitani "The Quarter-State Sequence (Q-sequence) to Represent the Floorplan and Applications to Layout Optimization" *IEEE APCCAS 2000—The 2000 IEEE Asia-Pacific Conference on Circuits and Systems* (Dec. 4-6, 2000) pp. 829-832.

Salek, A.H. et al. "Hierarchical Buffered Routing Tree Generation" *IEEE Transactions on Computer-Aided Design of Integrated Circuits and Systems* (May 2002) 21(5):554-567.

Sarrafzadeh, M. et al. "Single-Layer Global Routing" *IEEE Transactions on Computer-Aided Design of Integrated Circuits and Systems* (Jan. 1994) 13(1):38-47.

Schmiedle, F. et al. "Exact Routing with Search Space Reduction" *IEEE Transactions on Computers* (Jun. 2003) 52(6):815-825.

Séquin, C.H. and H. da Silva Façanha "Corner-Stitched Tiles with Curved Boundaries" *IEEE Transactions on Computer-Aided Design of Integrated Circuits and Systems* (Jan. 2003) 12(1):47-58.

Serdar, T. and C. Sechen "Automatic Datapath Tile Placement and Routing" *Conference and Exhibition on Design, Automation and Test in Europe* (Mar. 13-16, 2001) pp. 552-559.

Sim, S.-P. et al. "Analytical Capacitance Model for High-Speed Interconnects with Diagonal Routing" *Proceedings of the IEEE 2002 International Interconnect Technology Conference* (Jun. 3-5, 2002) pp. 157-158.

Su, S.J. and Y.S. Kuo "Multicell Quad Trees" *Proceedings of the 3rd European Conference on Design Automation* (Mar. 16-19, 1992) pp. 147-151.

Sun, P.K. "An Octagonal Geometry Compactor" *Proceedings of the 1998 IEEE International Conference on Computer Design: VLSI in Computer and Processors—ICCD '88* (Oct. 3-5, 1988) pp. 190-193.

Suzuki, G. et al. "MOSAIC: A Tile-Based Datapath Layout Generator" *ICCAD-92—1992 IEEE/ACM International Conference on Computer-Aided Design* (Nov. 8-12, 1992) pp. 166-170.

Tan, X. and X. Song "Improvement on the diagonal routing model" *IEEE Proceedings on Circuits, Devices and Systems* (Dec. 1994) 141(6):535-536.

Tarjan, R.E., ed. *Data Structures and Network Algorithms* Society for Industrial and Applied Mathematics, Philadelphia, PA (1983) pp. 71-83.

Tsai, C.-C. et al. "An H-V Alternating Router" *IEEE Transactions on Computer-Aided Design* (Aug. 1992) 11(8):976-991.

Tseng, H.-P. and C. Sechen "A Gridless Multi-Layer Router for Standard Cell Circuits using CTM Cells" *ED&TC—Proceedings of the European Design and Test Conference* (Mar. 17-20, 1997) pp. 319-326.

Tseng, H.-P. and C. Sechen "A Gridless Multilayer Router for Standard Cell Circuits Using CTM Cells" *IEEE Transactions on Computer-Aided Design of Integrated Circuits and Systems* (Oct. 1999) 18(10):1462-1479.

Tzionas, P.G. et al. "A New, Cellular Automation-Based, Nearest Neighbor Pattern Classifier and Its VLSI Implementation" *IEEE Transactions on Very Large Scale Integration (VLSI) Systems* (Sep. 1994) 2(3):343-353.

Wu, G.-M. et al. "Rectilinear Block Placement Using B*-Trees" *Proceedings of the International Conference on Computer Design* (Sep. 17, 2000) pp. 351-356.

Xing, Z. and R. Kao "Shortest Path Search Using Tiles and Piecewise Linear Cost Propagation" *IEEE Transactions on Computer-Aided Design of Integrated Circuits and Systems* (Feb. 2002) 21(2):145-158.

Xu, N. et al. "TSCSP: Tabu Search Algorithm for VLSI Module Placement Based on the Clustering Sequence-Pair" *5th International Conference on ASIC* (Oct. 21-24, 2003) 1:306-310.

Yamazaki, H. et al. "Optimum Packing of Convex-Polygons by a New Data Structure Sequence-Table" *IEEE APCCAS 2000—The 2000 IEEE Asia-Pacific Conference on Circuits and Systems* (Dec. 4-6, 2000) pp. 821-824.

Yan, Z. et al. "Area Routing Oriented Hierarchical Corner Stitching with Partial Bin" *Proceedings of the ASP-DAC 2000 Asia-South Pacific Design Automation Conference* (Jan. 25-28, 2000) pp. 105-110.

Yu, Z. et al. "Layout-based 3D Solid Modeling for IC" *Proceedings of the 1995 International Symposium on VLSI Technology, Systems and Applications* (May 31-Jun. 2, 1995) pp. 108-112.

Zhang, Y. et al. "A Gridless Router Based on Hierarchical PB Corner Stitching Structure" *IEEE 2002 International Conference on Communications, Circuits and Systems and West Sino Expositions* (Jun. 29-Jul. 1, 2002) 2:1438-1443.

Zheng, S.-Q. et al. "Efficient Maze-Running and Line-Search Algorithms for VLSI Layout" *Proceedings of the IEEE Southeastcon '93* (Apr. 4-7, 1993) 7 p.

Zheng, S.Q. et al. "Finding Obstacle-Avoiding Shortest Paths Using Implicit Connection Graphs" *IEEE Transactions on Computer-Aided Design of Integrated Circuits and Systems* (Jan. 1996) 15(1):103-110.

Zheng, S.Q. et al. "Routing Using Implicit Connection Graphs" *9th International Conference on VLSI Design* (Jan. 3-6, 1996) pp. 49-52.

* cited by examiner

MAXIMUM FLOW ANALYSIS FOR ELECTRONIC CIRCUIT DESIGN

FIELD OF THE INVENTION

The present invention relates generally to electronic circuit design and manufacturing, and more particularly to wire routing using an integrated circuit design automation system.

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

After the layout is complete, it is then checked to ensure that it meets the design requirements. The result is a set of design files, which are then converted into pattern generator files. The pattern generator files are used to produced patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

Geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

Many routing programs use "grid-based" routing techniques. During grid-based routing, wires are routed along defined and equally spaced grid lines of a grid array. Grid lines of the grid array are used in the routing process to speed up the process of finding the wire routing solutions by reducing the number of pathways to consider for routing. The grid-based router, however, has several drawbacks.

A disadvantage of the grid-based router is that it is difficult for a grid-based router to route with circuit blocks that do not have a signal-defined grid array. Modern IC and circuit board designs typically include circuit blocks having different dimension grid arrays. As a result, the grid-based router may not be able to match pins of different blocks with different dimension grid arrays. Another disadvantage of the grid-based router is that it is very inflexible, because it is highly dependent on wire length, wire width, and wire separation, and not on a predefined wire grid array. Therefore, for example, forcing wires to lie on predefined grid lines may not optimally address the greater underlying problem of signal delay. Another problem of the grid-based router is that it tends to waste a large percentage of routable area within an integrated circuit substrate.

Gridless routers can also be employed to route an integrated circuit design. A shape-based router is an example of a gridless router. Because the gridless router is not directly tied to a predefined grid array, it alleviates some of the grid-based router's disadvantages. The shape-based router, however, has its own problems. For example, known approaches to implementing this type of gridless router use a non-hierarchical data model that tends to consume an excessive amount of computing resources and slows down performance speed. In addition, its non-hierarchical data model also increases the difficulty of designing modern complex integrated circuits.

Although conventional grid-based routers and shape-based routers have been adequate to serve the routing process for IC designs, new IC routing technology is required because semiconductor fabrication process advancements are antiquating current technologies. Moreover, customers are continually demanding lower manufacturing costs, higher speed, more capacity, more capability, and increased performance from their routers.

Routers perform congestion and maximum flow analysis to determine the maximum number of routes or wires permitted in a given region of a chip layout. However, known congestion and maximum flow techniques are subject to significant drawbacks. For example, one approach for making a maximum flow analysis is to tessellate a design into grids, and determine the amount of wires that can be routed through the grid by forming tracts across the grid (either horizontal or vertical tracks depending upon the preferred routing direction). The number of tracts that span from one edge of the region or window to another without striking an object within the grid is used to determine the routing capacity of the grid. However, if a grid has a non-linear path that is free of obstructions, the free path is undetected by these methods.

SUMMARY

The present invention provides embodiments for improved methods and mechanisms for congestion and maximum flow analysis for routing an integrated circuit design. In one embodiment, maximum flow analysis is performed by tessellating a portion of a layout to form space tiles, which are used to interpret a flow graph. The flow graph comprises a set of vertices and edges. The capacity of edges in the flow graph is used to identify the maximum flow for that portion of the layout. In an alternate embodiment, an edge walk is performed against a set of space tiles, in which a nearest neighbor determination is determined for each edge to perform maximum flow analysis. Other and additional objects, features, and advantages of the invention are described in the detailed description, figures, and claims.

DETAILED DESCRIPTION

The present invention provides embodiments for improved methods and mechanisms for congestion and maximum flow analysis for routing an integrated circuit design. Space tiles are employed in various embodiments to implement maximum flow analysis.

Space Tiles

A set of space tiles is formed by tessellating an area within an IC design. A space tile corresponds to a plane figure in the tessellation. In one embodiment, the contours of some or all of the space tiles are derived from or are based upon the shapes of existing objects in the tessellated area. "Free" space tiles refer to space tiles which are presently unoccupied. "Used" space tiles refer to space tiles that are occupied by one or more objects. An example of a prior product that tessellates an area of a layout to identify free space tiles is the IC Craftsman layout automation product, available since at least 1998 from Cooper and Chyan Technology, now owned and distributed by Cadence Design Systems, Inc. of San Jose, Calif.

Figure 1A:
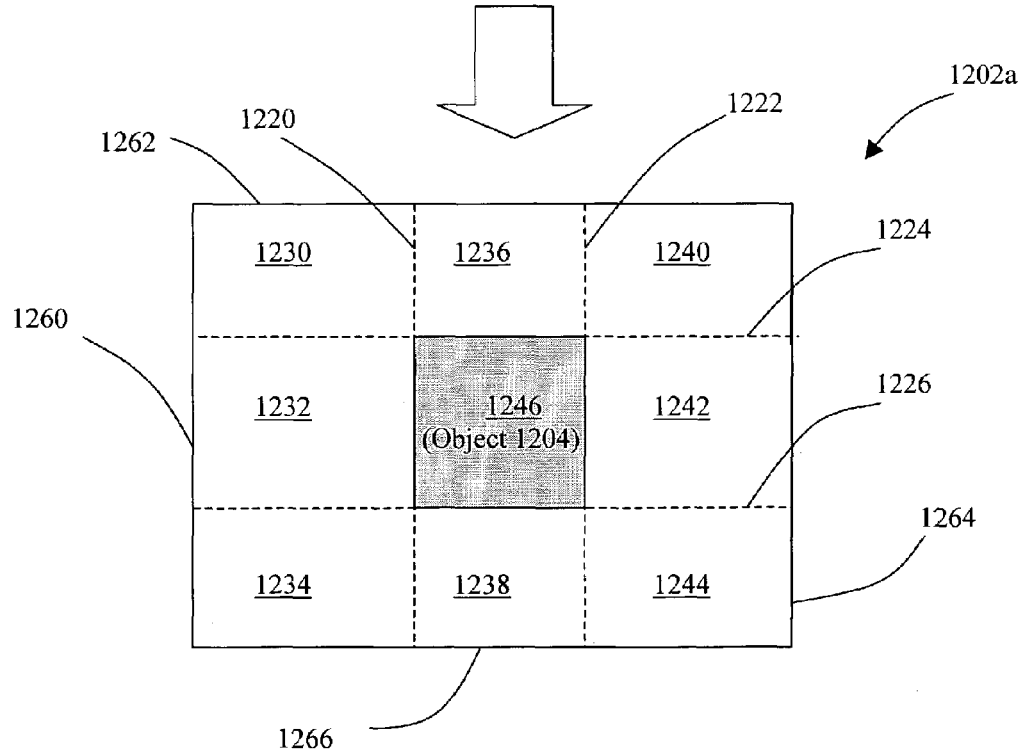
FIGS. 1a–d show example approaches for implementing space tiles.

Identifying free space tiles provides an approach for determining available locations to route wires or place objects on a chip. Since the space tiles are not dependent upon the concept of a grid, space tiles allow gridless routing to be performed. Various approaches can be employed to form space tiles on a chip. In one embodiment, the space tiles are formed based upon or derived from the shapes of existing objects in the chip sections (although some or all of the space tiles can also be arbitrarily shaped). For example, one approach to forming space tiles having contours derived from existing shapes is to identify the edges of existing objects within a window, and extending those edges (e.g., using hyper-planes) to define boundary lines within the window. These boundary lines become the borders of spaces tiles within the window. FIG. 1a illustrates this approach for forming space tiles using the boundaries of existing shapes within a chip portion. In FIG. 1a, an existing shape/object 1204 is located in a window 1202. Object 1204 is shaped such that it includes a top edge 1208, bottom edge 1212, left edge 1206, and right edge 1210. Throughout this document, orientation-related terms such as "top", "bottom", "left", and "right" are used to provide a thorough explanation of the invention; it is noted that no intent is intended by these terms to limit the scope of the invention.

As shown in revised window 1202a, each of the edges 1206, 1208, 1210, and 1212 on object 1204 are extended in both directions until they reach the edge/boundary of the window 1202a or another object. These edge extensions form boundary lines in the window 1202a. Thus, edge 1206 is extended to form boundary line 1220. Similarly, edge 1208 is extended to form boundary line 1224, edge 1210 is extended to form boundary line 1222, and edge 1212 is extended to form boundary line 1226. If window 1202a contains additional shaped objects, this process repeats for each additional object in the window.

A space tile corresponds to each portion of window 1202a bounded by a set of boundary lines, or bounded by boundary lines and the edge of the window 1202a. Thus, space tile 1230 corresponds to the portion of window 1202a bounded by boundary line 1220, boundary line 1224, left window edge 1260, and top window edge 1262. Space tile 1232 corresponds to the portion of window 1202a bounded by boundary line 1224, boundary line 1220, boundary line 1226, and left window edge 1260. In a similar manner, space tiles 1234, 1236, 1238, 1240, 1242, and 1244 correspond to the various boundary lines and window edges shown for window 1202a. Note that each of these space tiles 1230–244 are vacant of any shapes or objects. Since these space tiles are presently empty, they are considered free space tiles eligible to receive additional objects or shapes.

Object 1204 is entirely bounded by boundary lines (boundary lines 1220, 1222, 1224, and 1226). The region bounded by these boundary lines itself forms a space tile 1246, which is entirely occupied by object 1204. Since space tile 1246 is completely filled by object 1204, it is considered a used space tile that is not eligible to receive any additional objects or shapes. The data structure used to maintain a space tile can include one or more data elements identifying its neighboring space tiles. This neighbor information is used to facilitate identification of adjacent free space tiles in the routing paths through the layout.

The dimensions of the space tiles can be adjusted to allow compliance with design and manufacturing rules. Since one reason for identifying free space tiles is to identify regions of the chip that are available to locate additional objects, the dimensions of the space tiles may be adjusted to ensure that placing an object in the free space tile will not create a conflict, e.g., a design rule checking ("DRC") violation, with other existing objects on the layout.

Figure 1B:
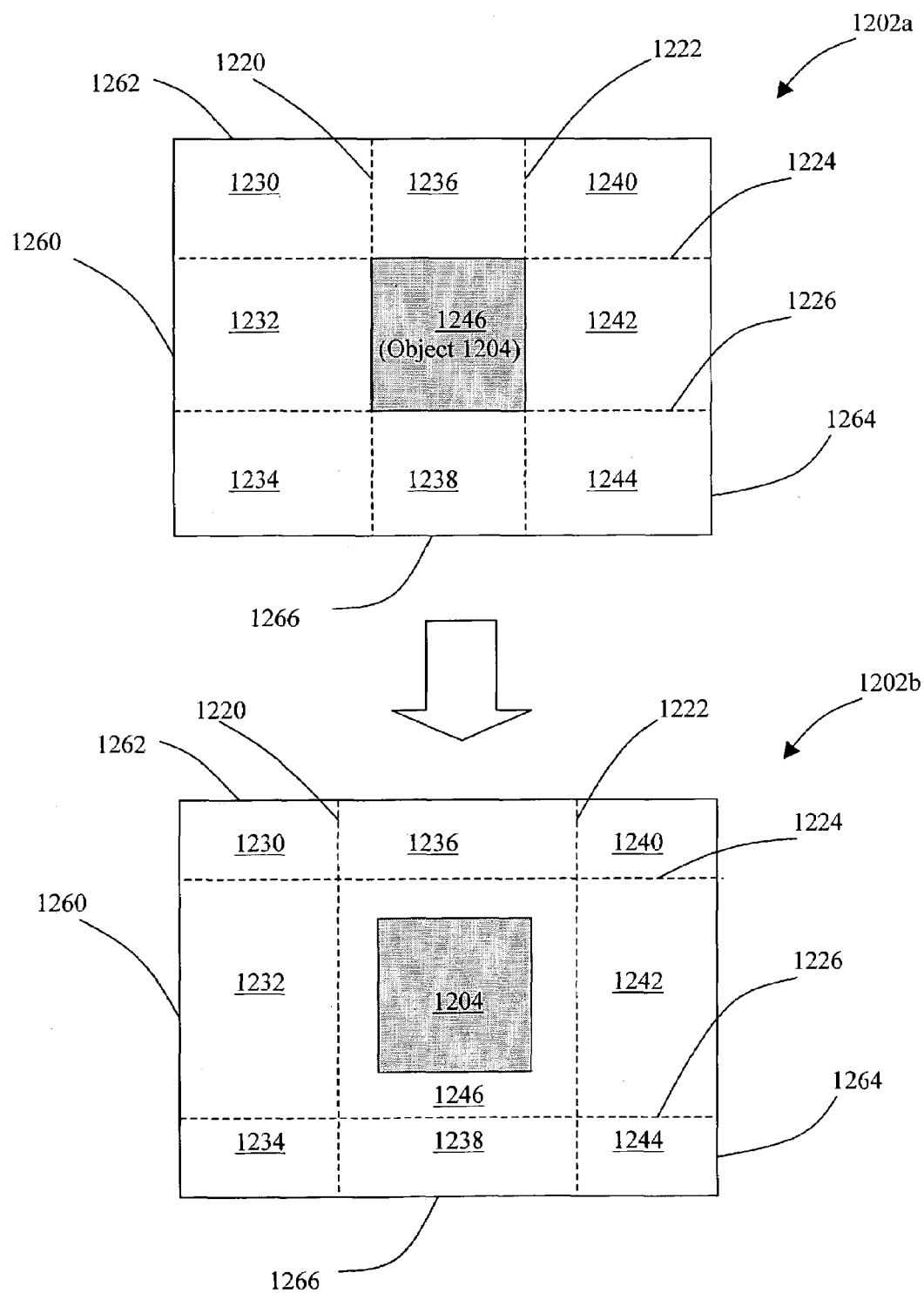

Referring to FIG. 1b, shown is the window 1202a containing the free space tiles 1230, 1232, 1234, 1236, 1238, 1240, 1242, and 1242 that were created surrounding object 1204 and its corresponding used space tile 1246 in FIG. 12a. Without taking design rules into account, each of the free space tiles 1230–244 directly abut the used space tile 1246, since the only consideration taken to this point to form the free space tiles has been to identify the exact exterior dimensions of the object 1204.

To comply with design rules, a fence can be created around object 1204 that identifies a surrounding distance in which other objects cannot be placed. Thus, boundary lines 1220, 1222, 1224, and 1226 are shifted by a given clearance distance away from the edges of object 1204, as shown in window 1202b. As before, the boundary lines form the boundaries of the resultant space tiles in the window 1202b. Thus, it can be seen that used space tile 1246 now includes a fence around object 1204 that is not actually occupied, but is considered "used" to prevent other objects from being placed within that region in a way that would violate design or manufacturing rules.

In one embodiment, the boundary lines are used to show the permissible boundaries of locations for the centerline of objects (e.g., wires) that can be placed at or through the free space tiles. Thus, the boundary lines actually form a "clearance shadow" that is the clearance distance plus half the width of the object that is to be moved. In other words, the boundaries of the free space tiles are identified such that an object can be permissively moved with its centerline overlaid on the free space tile boundary without causing a conflict with an existing object.

Figure 1C:
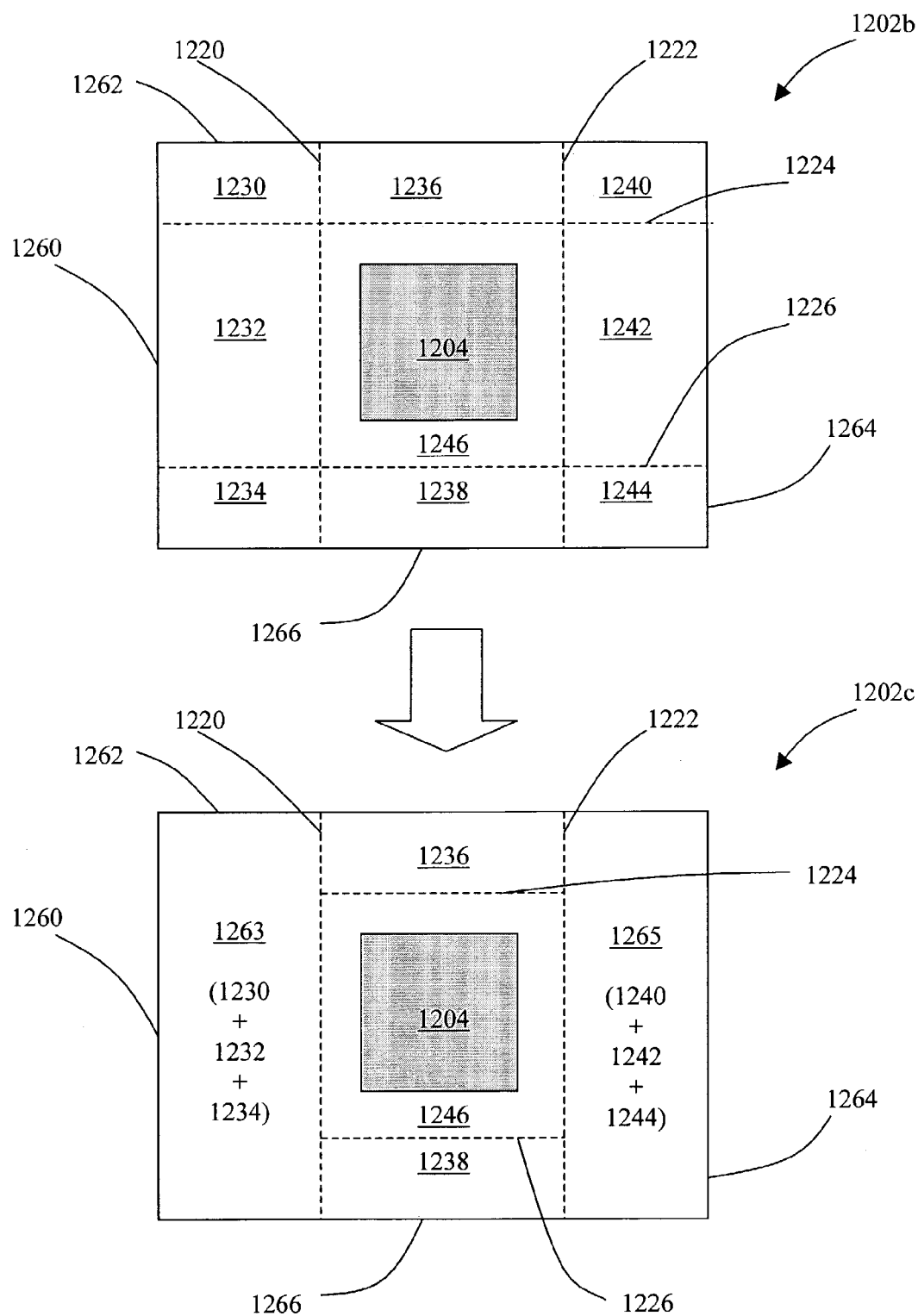

Once the free space tiles have been established, some or all of the free space tiles can be combined into larger free space tiles. Referring to FIG. 1c, it can be seen that free space tiles 1230, 1232, and 124 have been combined into a single large free space tile 1263 along the left portion of the window 1202c. Similarly, free space tiles 1240, 1242, and 1244 have been combined into a single large free space tile 1265 along the right portion of window 1202b.

Alternatively, these larger free spaces 1263 and 1265 are initially created when the free space tiles are identified, such that the breakup of space in the area of window 1202 is not symmetric. This allows the tiles in one area (i.e., free space tiles 1263 or 1265) to extend all the way to the edges of the used space tile 1246, but tiles in other areas do not, i.e., free space tiles 1236 and 1238. In one embodiment, this is considered "preferred vertical" fracturing that can be used on a layer with preferred vertical routing. In an embodiment, the preferred fracturing direction of each layer is controllable and optional.

The process of tessellating a chip portion or area into space tiles can also be referred to as space tile "punch." During the punch process, identification is made of all the shapes that affect the area and which affect the formation of space tiles. In one approach, punching a shape leaves a hole in the tile area where the shape being punched is located. Alternatively, the used space tiles can be left behind.

Figure 1D:
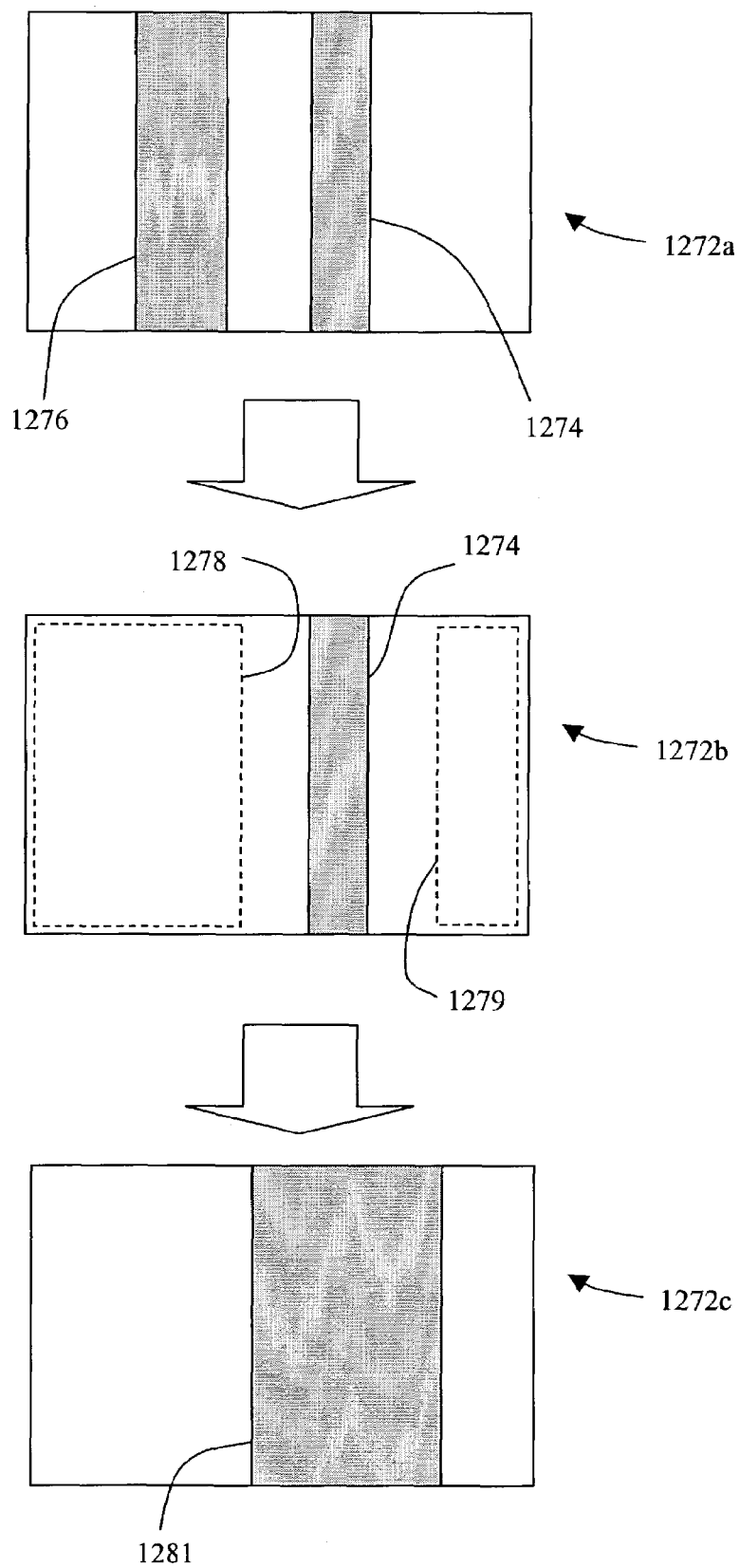

When performing a punch against an object, this action identifies free space tiles against a version of the window in which the object does not appear since the object is possibly being moved. Referring to FIG. 1d, shown is a window 1272a containing wire segment 1276 and wire segment 1274. Consider if it is desired to perform a space tile punch against wire 1276, i.e., to determine the free space tiles in window 1272a with respect to wire 1276.

Revised window 1272b shows the result of performing a space tile punch against wire 1276. As previously noted, the space tile punch operation determines the free space tiles after the subject object has been removed from consideration. After removing wire 1276, only wire 1274 remains as a show in window 1272b. Thus, the free space tiles are identified based upon the contours of wire 1274. Here, the result of the space tile punch is a first free space tile 1278 along the left edge of the window 1272b and a second free space tile 1279 along the right edge of window 1272b. Note that these free space tiles do not extend directly against the remaining wire 1274. For the purposes of performing the punch operation, wire 1274 is considered an obstruction, and the free space tiles are adjusted to ensure compliance with distance requirements for the design rules. Thus, the boundaries of free space tiles 1278 and 1279 are adjusted away from wire 1274 to a clearance distance corresponding to DRC correctness requirements. Thus, free space tiles 1278 and 1279 now identify the boundaries (with respect to the centerline of wire 1276) of the locations/paths at which wire 1276 can be permissively moved within window 1272b. Revised window 1272c shows an inverted view in which the entire region that is considered unavailable is shown as a used space tile 1281. The examples of FIGS. 1a–d illustrates one approach for identifying orthogonal space tiles. It is noted that similar approach can also be used to form non-orthogonal space tiles, if non-rectangular shapes exist in the region of interest on the chip. Further details of an exemplary approach for implementing space tiles is disclosed in co-pending U.S. application Ser. No. 10/642,863, entitled "Non-Orthogonal Structures and Space Tiles For Layout, Placement, and Routing of an Integrated Circuit", filed concurrently herewith, which is hereby incorporated by reference in its entirety.

Maximum Flow Analysis

Figure 2:
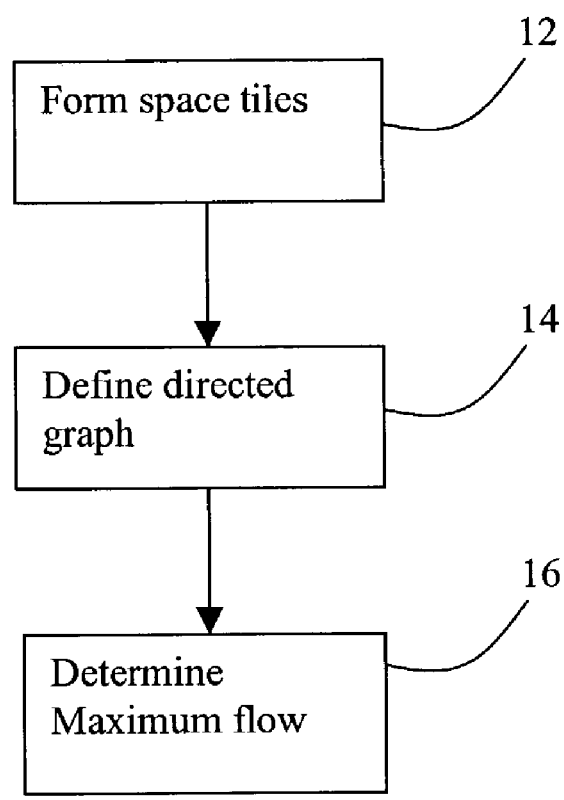
FIG. 2 is a flowchart of an embodiment of a process for performing maximum flow analysis.

FIG. 2 shows a flowchart of a method for performing maximum flow analysis according to a first embodiment of the invention. As a first action, the portion of the chip layout under analysis is tessellated into a collection of space tiles (12), e.g., using the approaches described with respect to FIGS. 1a–d. For each free space tile, a space tile data structure is maintained listing neighbors on each edge of the free space tile, such as a north neighbor, a south neighbor, an east neighbor, and a west neighbor, for example, to permit navigation through the graph of space tiles. Neighbors in an up or down direction, which may be located on another layer, may be identified by a look-up method.

The space tiles are interpreted to form a flow graph (14), which is a directed graph in which each edge is associated with a capacity. A set of vertices correspond to sources, each of which can produce an unlimited quantity of flow, and a set of vertices correspond to sinks, each of which can drain an unlimited amount of flow.

Once the directed graph has been defined, any suitable maximum flow approach may be used to perform a maximum flow analysis against the directed graph (16). The capacity of the edges in the graph can be analyzed to provide a measure of the maximum wiring capacity. In one embodiment, the capacity of the edges in the directed graph corresponds to the length of the boundaries between neighboring space tiles for those edges. Determining the smallest boundary length between adjacent free space tiles along the directed graph provides a measure of the maximum flow for the layout portion under analysis. This approach therefore converts a geometric problem of routing into a graphical problem that may be solved with a maximum flow method.

Figure 3:
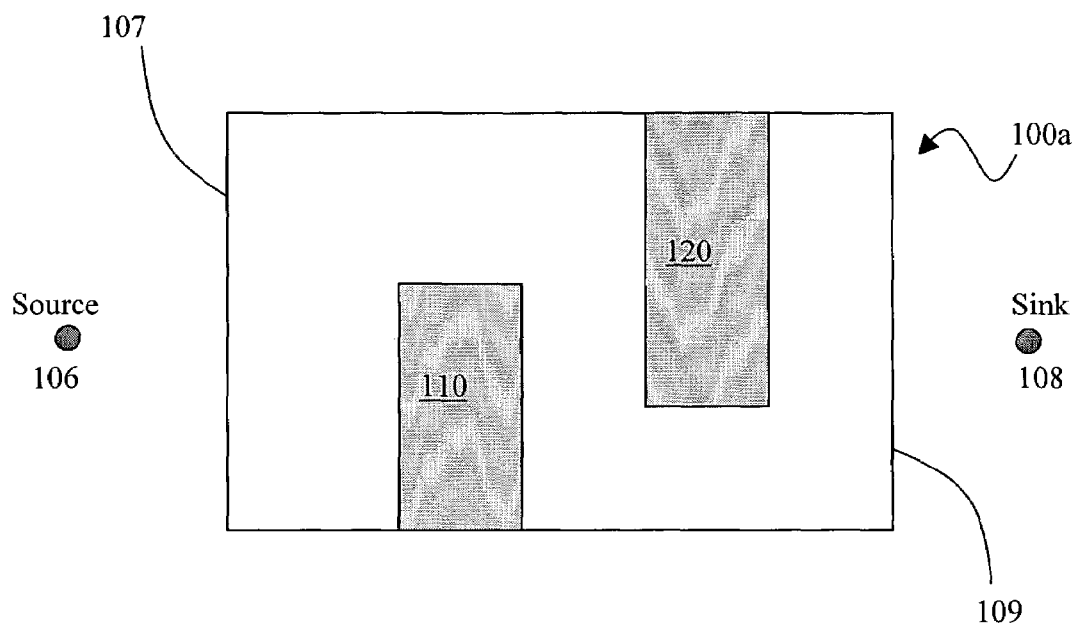
FIGS. 3–5 illustratively show a method for interpreting a directed graph to perform maximum flow analysis according to an embodiment of the invention.

FIG. 3 illustrates an example chip layout scenario in which it is desirable to perform a congestion/maximum flow analysis. As shown in FIG. 3, objects 110 and 120 are located in a gcell 100a. As used herein, a gcell refers to any portion, partition, or window that may be created in the chip layout. One approach for implementing gcells is described in co-pending U.S. application Ser. No. 10/342,862, entitled "Hierarchical Gcell Method and Mechanism", filed on even date herewith, which is hereby incorporated by reference in its entirety.

A source node 106 is located on the left side of gcell 100a. A sink node 108 is located on the right side of gcell 100a. Congestion and maximum flow analysis are performed to determine the quantity of wires that can be routed from the source node 106 to sink node 108.

Figure 4:
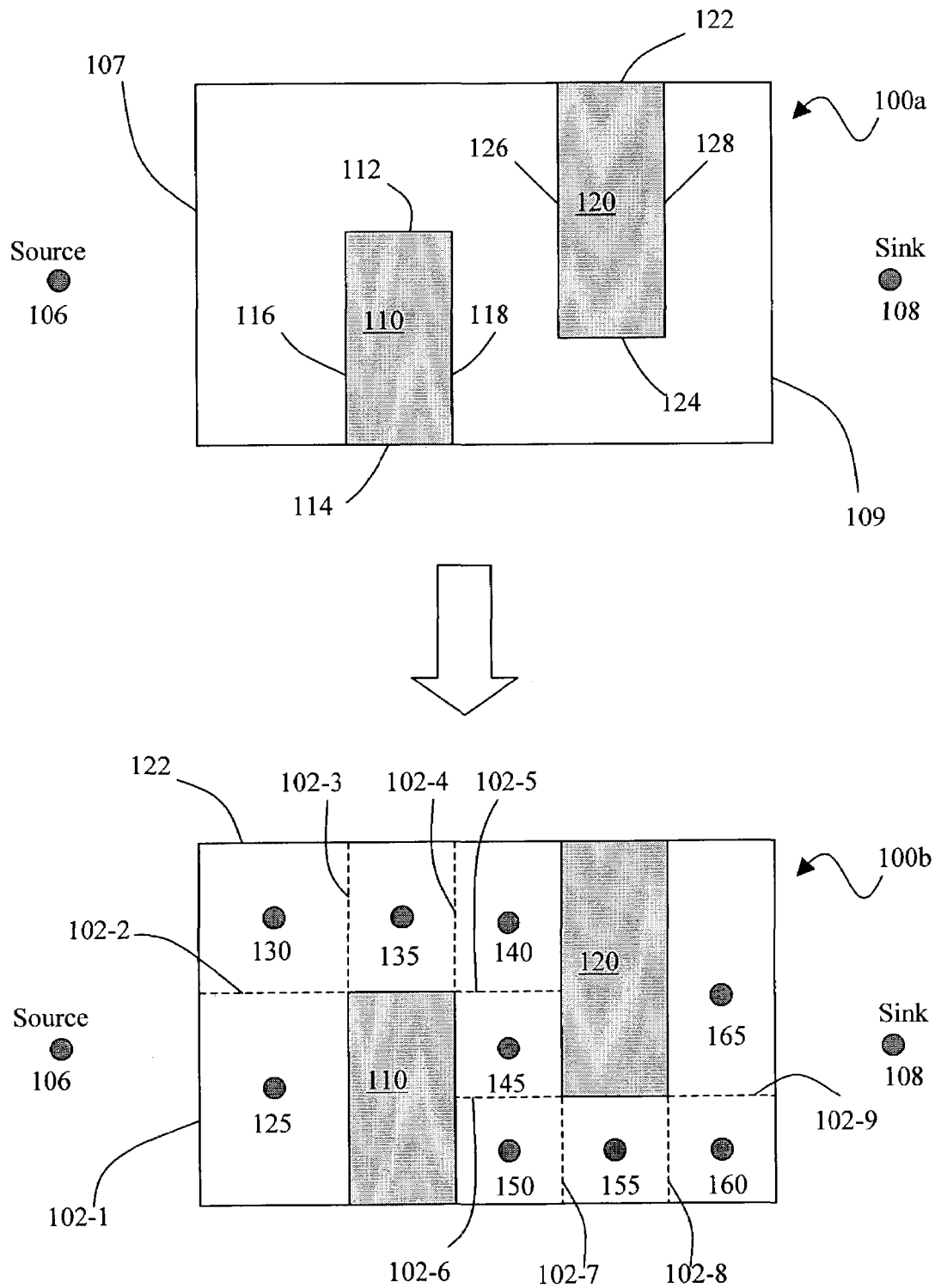

FIG. 4 illustrates an approach for tessellating gcell 100a into a set of space tiles. Object 110 is shaped such that it includes a top edge 112, a bottom edge 114 along the lower boundary of the gcell, a left edge 116, and a right edge 118. Object 120 has a top edge 122 along the upper boundary of the gcell, a bottom edge 124, a left edge 126, and a right edge 128.

As shown in revised gcell 100b, each of the edges 112, 114, 116, and 118 on object 110 are extended in horizontal and vertical directions until they reach the edge/boundary of the gcell, or another object, such as object 120 for example. These edge extensions form boundary lines in the window 100b. Thus, edge 112 is extended to form boundary lines 102-2 and 102-5. Similarly, edge 116 is extended to form boundary line 102-3, and edge 118 is extended to form boundary line 102-4. The edges 122, 124, 126, and 128 on object 120 are extended in horizontal and vertical directions until a boundary, such as another object or the edge of the gcell for example, is reached. The extended edges of object 120 form boundary lines 102-6, 102-7, 102-8, and 102-9. If the gcell contains additional shaped objects, this process repeats for each additional object in the gcell.

A space tile corresponds to each portion of window 100b bounded by a set of boundary lines, or bounded by boundary lines and the edge of the window 100b. Each space tile is associated with a vertex (which is shown as the filled circle in the middle of each space tile in FIG. 4). Thus, the space tile identified by vertex 125 corresponds to the portion of window bounded by boundary line 102-2, boundary line 116, left window edge 102-1, and bottom window edge 114. The space tile identified by vertex 130 corresponds to the portion of window 100b bounded by boundary line 102-2, boundary line 102-3, upper window edge 122, and left window edge 102-1. In a similar manner, the free space tiles identified by vertices 135, 140, 145, 150, 155, 160, and 165 correspond to the various boundary lines and window edges shown for window 100b. These space tiles are vacant of any shapes or objects and are therefore considered as free space tiles eligible to receive additional objects or shapes.

Object 110 is entirely bounded by boundary lines (boundary lines 112, 114, 116, and 118). The region bounded by these boundary lines itself forms a space tile, which is occupied by object 110. Therefore, this space tile is considered a used space tile that is not eligible to receive any additional objects or shapes. The space tile occupied by object 120 is also not eligible to receive any additional objects or shapes.

Figure 5:
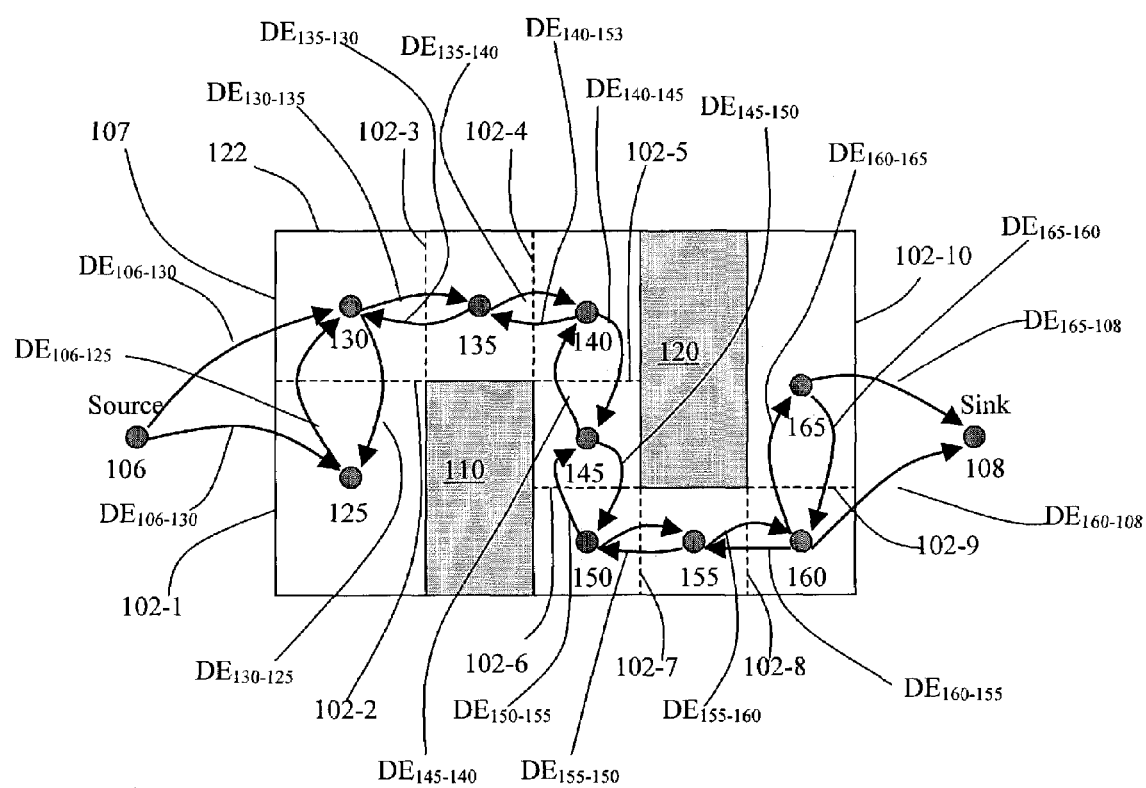

The collection of space tiles can be used to interpret a directed graph from the source node 106 to the sink node 108. As noted above, each free space tile is associated with a vertex. An edge exists in the directed graph between any two adjacent vertices. As shown in FIG. 5, the directed graph defined by the space tiles in gcell 100 comprise 11 vertices, including vertices for source 106, sink 108, and vertices 125, 130, 135, 140, 145, 150, 155, 160, and 165 for the free space tiles. The directed graph in FIG. 5 comprises 20 directed edges, including directed edges $DE_{106-125}$, $DE_{106-130}$, $DE_{125-130}$, $DE_{130-125}$, $DE_{130-135}$, $DE_{135-130}$, $DE_{135-140}$, $DE_{140-135}$, $DE_{140-145}$, $DE_{145-140}$, $DE_{145-150}$, $DE_{150-145}$, $DE_{150-155}$, $DE_{155-150}$, $DE_{155-160}$, $DE_{160-155}$, $DE_{160-165}$, $DE_{165-160}$, $DE_{165-108}$, and $DE_{160-108}$.

In one embodiment, the capacity of an edge is the length of the shared boundary between two adjacent space tiles. Given this interpretation as a flow graph, one can determine the maximum flow from source node 106 to sink node 108 using any maximum flow algorithm. The resulting maximum flow can be interpreted as the amount of wiring that can be placed in the gcell, starting on the left edge 107 and ending on the right edge 109.

The edges of the directed graph correspond to a boundary between two adjacent free tiles. A shared boundary (or edge) exists between adjacent free space tiles referenced by the directed graph. These shared boundaries are expressed in FIG. 5 as the boundary lines 102-2, 102-3, 102-4, 102-5, 102-6, 102-7, 102-8, and 102-9. The wiring capacity of each shared boundary is the number of wires that have a combined width that is less than or equal to the width of the shared boundary, taking into account any clearance distances that must be maintained. For example, the shared boundary between free space tile 130 and free space tile 135 is boundary line 102-3. The maximum capacity (i.e., the number of wires) that can be routed between space tile 130 and space tile 135 is therefore limited by the width of boundary line 102-3.

One suitable maximum flow algorithm is the Ford-Fulkerson method, which computes a maximum flow by finding paths in the flow graph. This algorithm is used below to illustrate the present embodiment, although any appropriate maximum flow algorithm can be used. Referring to FIG. 5, a "tile walk" is performed to traverse the vertices of the free space tiles in the path(s) between source node 106 and sink node 108 to identify the edges of the directed graph. The tile walk proceeds through each adjacent free space tile from the original source node 106 to the sink node 108.

In the example of FIG. 5, the free space tile walk begins from source node 106 to free space tile 125, and continues through each adjacent node to sink node 108. It is noted that source node 106 may also begin by walking to the vertex of space tile 130. Thus, the edge between the first vertex for source node 106 and the vertex of space tile 125 is identified as $DE_{106-125}$. The edge between the first vertex for source node 106 and the vertex of space tile 130 is identified as $DE_{106-130}$. The edge between the vertex for free space tile 125 to the vertex of space tile 130 is identified as $DE_{125-130}$ and is identified as edge $DE_{130-125}$ in the reverse direction. Similarly, the directed edge between the vertex for free space tile 130 and the vertex of space tile 135 is identified as $DE_{130-135}$ and is identified as edge $DE_{135-130}$ in the reverse direction. The tile walk proceeds through each adjacent free space tile from each source vertex to each sink vertex. The tile walk proceeds from free space tile 125 to free space tile 130, then from tile 130 to 135, from 135 to 140, from 140 to 145, from 145 to 150, from 150 to 155, from 155 to 160, from 160 to 165, and from 165 to 108. This constitutes a path from source 106 to sink 108 in the flow graph.

This walk corresponds to edges $DE_{106-125}$, $DE_{106-130}$, $DE_{125-130}$, $DE_{130-135}$, $DE_{135-140}$, $DE_{140-145}$, $DE_{145-150}$, $DE_{150-155}$, $DE_{155-160}$, $DE_{160-165}$, $DE_{165-160}$, $DE_{165-108}$ Some shared boundaries may have a greater width than other shared boundaries. In the present embodiment, the maximum flow of the gcell is constrained by the smallest shared boundary referenced by the directed edges of the graph. The maximum capacity of the gcell is therefore the maximum capacity of the smallest shared boundary for the free space tiles associated with the directed graph.

In one embodiment, the capacity of each edge in the directed graph is considered to determine if it is smaller than an edge that has already been considered. After considering all edges on the graph, the process will have identified the edge corresponding to the smallest edge capacity, which is the maximum flow capacity of the path between the source node 106 and the sink node 108. For the example directed graph of FIG. 5, the capacity of edge $DE_{106-125}$ is the capacity of the shared boundary 102-1 between source node 106 and the vertex for free space tile 125, which is represented as $Width_{102-1}$. The process continues for the vertex for space tile 125 to/from the vertex for space tile 130, through shared boundary 102-2, which has a capacity of $Width_{102-2}$. Assume that $Width_{102-1} > Width_{102-2}$. Therefore, $Width_{102-2}$, which is the capacity of boundary 102-2, is identified as the new smallest capacity. The process then proceeds between the vertex for space tile 130 and the vertex for space tile 135. Assume that the stored capacity $Width_{102-2}$ is equal to the capacity of shared boundary 102-3 ($Width_{102-3}$). Since the present capacity for the shared boundary is not smaller than the stored capacity, the stored capacity $Width_{102-2}$ does not change. The process next proceeds between the vertices for space tile 135 and space tile 140, which has a shared boundary 102-4. Again assume that the capacity of shared boundary 102-4 is not less than the stored capacity, which causes the value of the stored capacity to remain the same.

The process continues for the vertex for space tile 140 and space tile 145, which has a shared boundary 102-5 having a capacity of $Width_{102-5}$. Assume that $Width_{102-5}$ is less than the stored capacity $Width_{102-2}$. Because the capacity of the present shared boundary 102-5 is less than the stored capacity, the capacity of shared boundary 102-5 ($Width_{102-5}$) becomes the new stored capacity. The process continues between the vertices for tiles 150, 155, 160, 165, and sink node 108 through shared boundaries 102-6, 102-7, 102-8, 102-9, and 102-10, respectively. Assume that none of the shared boundaries 102-6, 102-7, 102-8, 102-9, and 102-10 encountered during this walk has a capacity that is less than the stored capacity. Thus, none of these shared boundaries will provide a capacity that will change the stored capacity. By the process of examining the capacity of edges in the flow graph (and their associated shared boundaries between the free space tiles), the final value of the stored capacity is $Width_{102-5}$.

Therefore, the maximum flow that may be routed between source node 106 and the sink node 108 is the capacity represented by $Width_{102-5}$, which is the width of the shared boundary 102-5 between free space tile 140 and free space tile 145. This satisfies the condition that the amount of wires entering each free space tile of the gcell, from a shared boundary to the node, is less than or equal to the amount of wires exiting the free space tile from the node to another shared boundary. As shown by this example, the space tile engine can be used to create space tiles to map a geometric problem to a graph problem.

Figure 6:
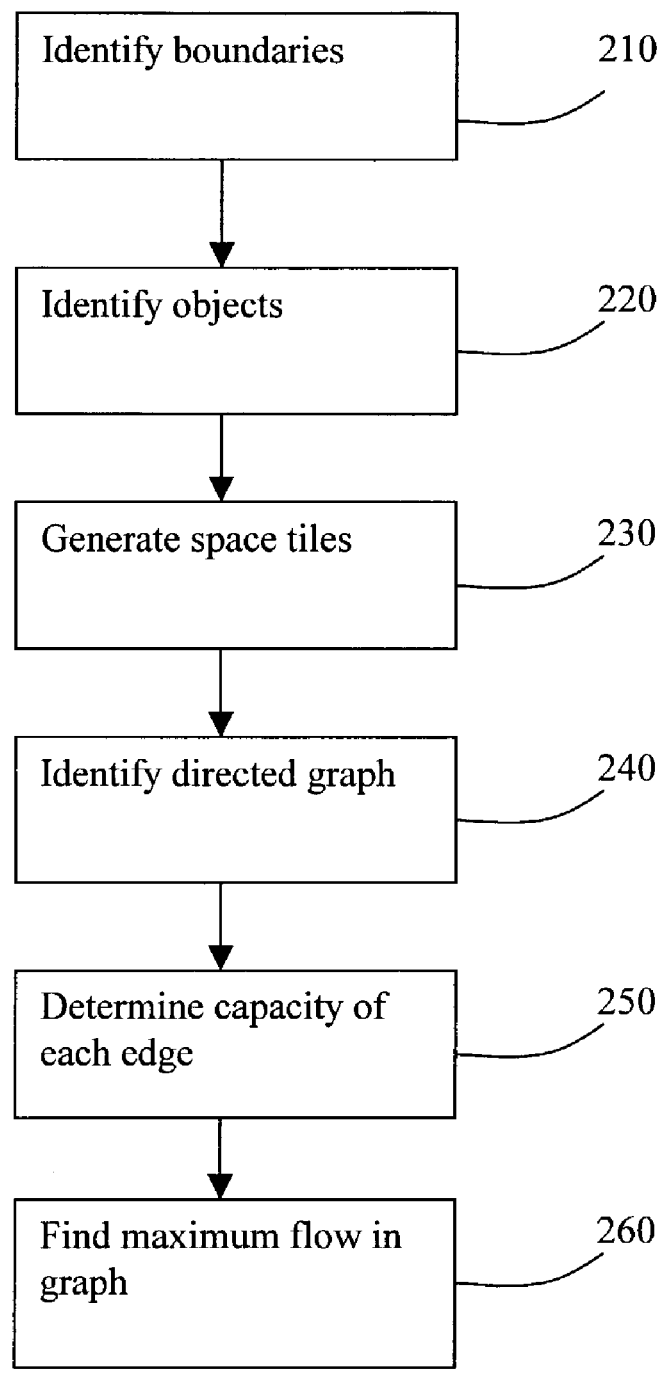
FIG. 6 depicts a flowchart of a process for interpreting a directed graph to perform maximum flow analysis according to an embodiment of the invention.

FIG. 6 shows a flowchart of an embodiment of a method of using space tiles to determine maximum flow through a gcell. Boundaries of a gcell are identified at 210. Objects within the gcell are identified at 220. The objects may be identified, for example, by using zone trees and forests to perform a search of the region within the boundaries of the gcell. An example approach for using zone trees and zone forests is described in co-pending U.S. application Ser. No. 10/342,823, entitled "Zone Tree Method and Mechanism", filed on even date herewith, which is hereby incorporated by reference in its entirety.

Free space tiles and used space tiles for the gcell are generated (230). Each edge of a space tile, either free or used, may be shared with one other space tile or with a boundary of the gcell. Based upon the free space tiles, a directed graph is defined (240). A capacity of each edge along the path through the free space tiles is determined (250). The maximum flow of the graph is determined by the capacity of the shared boundaries for the free space tiles corresponding to the graph.

Figure 7:
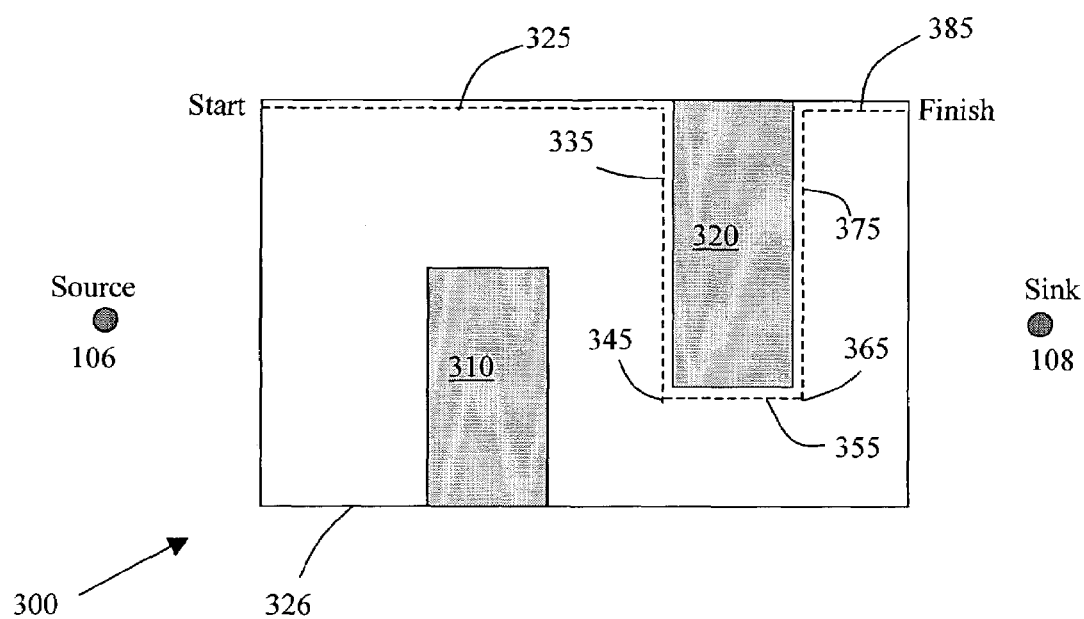
FIGS. 7–11 illustratively show an embodiment of a method for performing maximum flow analysis by walking space tile edges and performing nearest neighbor determinations.

FIGS. 7–11 illustrates another embodiment of a method and mechanism for performing maximum flow analysis that uses space tiles to geometrically perform the analysis. In this embodiment, an "edge walk" is performed to walk along the edges of the space tiles to determine the maximum flow. Referring to FIG. 7, the edge walk begins at a space tile having a shared edge with a source node 306. The edge walk is performed along an edge of the space tile. For example, the edge walk may be along a "left" edge 325 of the tile (note that the edge walk may also be performed starting with the "right" edge 326—either approach may be used in embodiments of the invention). When an object 320 is encountered during the edge walk, a turn is made so that the walk continues along a left edge 335 of a space tile. The edge walk continues along edges 355, 375, and 385, until a shared edge with a sink node 308 is reached.

Figure 8:
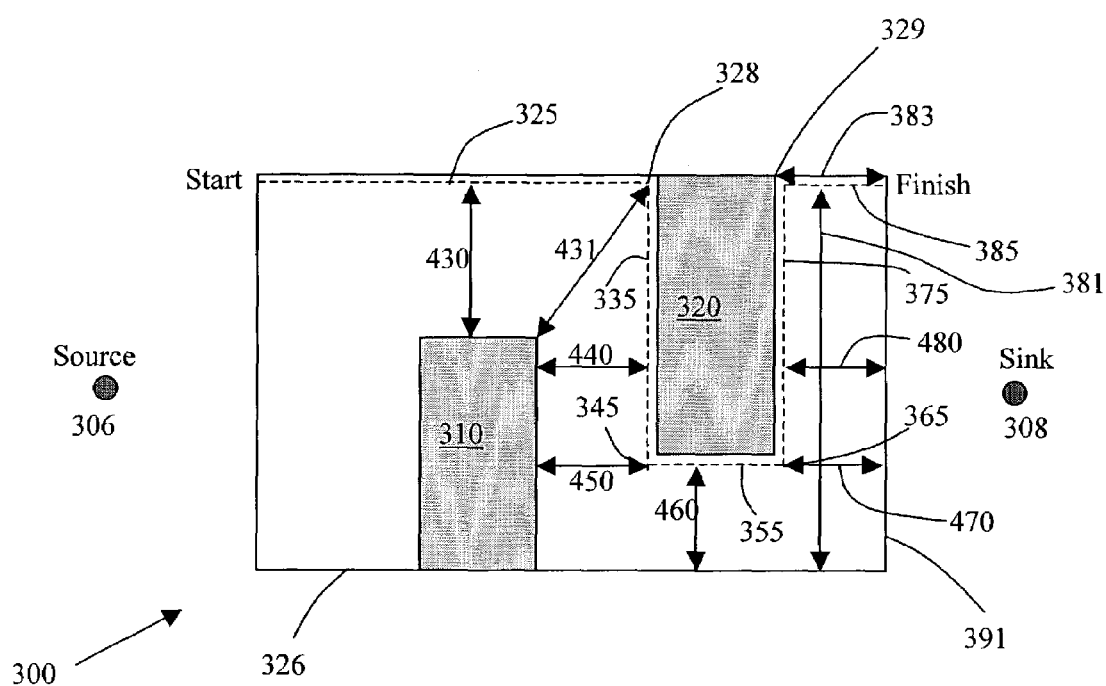

For each edge and each corner along the edge walk, a nearest neighbor determination is made, as shown in FIG. 8. The nearest neighbor determination identifies the closest object or other edge relative to the object at hand. Any suitable approach for determining a nearest neighbor can be employed, such as the approach for performing a nearest neighbor determination disclosed in co-pending U.S. application Ser. No. 10/342,823, entitled "Nearest Neighbor Mechanism", filed on even date herewith, which is hereby incorporated by reference in its entirety.

The nearest neighbor of left edge 325 is object 310, which is a distance 430 from the edge. The nearest neighbor to corner 328 is object 310, which is a distance 431 from the corner. The nearest neighbor to edge 335 is object 310 at a distance 440. The nearest neighbor to corner 345 is object 310 at a distance 450. The nearest neighbor to edge 355 is the lower edge of the gcell at a distance 460. The nearest neighbor from corner 365 is edge 391 of the gcell at a distance 470. The nearest neighbor from edge 375 is also the edge 391 of the gcell at a distance 480. The nearest neighbor to corner 329 is edge 391 of the gcell at a distance 383. The nearest neighbor to edge 385 is edge 326 of the gcell at a distance of 381.

During the walk, the current distance to nearest neighbor of an edge or a corner is compared with a smallest distance. If the current distance is less than the smallest distance, then the current distance becomes the smallest distance. In the example of FIG. 8, assume that the smallest distance is the distance 440 from edge 335 to object 310.

Figure 9:
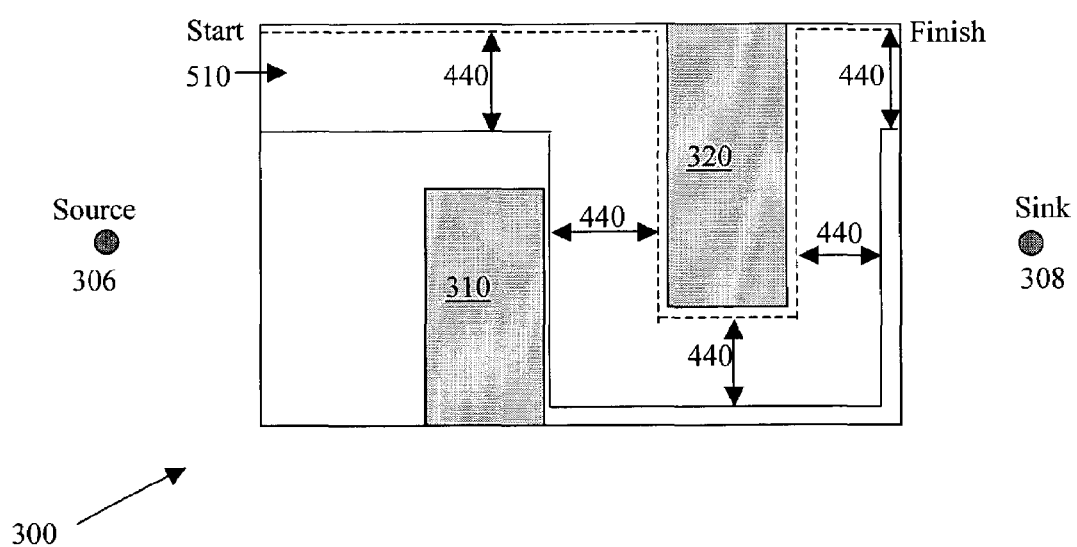
Figure 10:
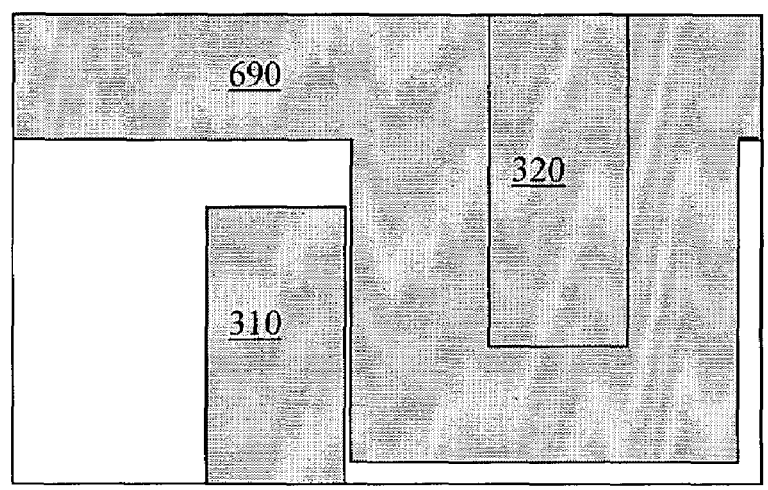

After the smallest distance is determined, the left edge walk is used to generate a routing path 510 from the source through the free space to the sink. The routing path 510 has a width 440 equal to the smallest distance, as shown in FIG. 9. The capacity of the gcell 300 is the number of wires that can be contained within path 510. After this capacity is determined, the path of free space tiles are marked as used space tiles 690 as shown in FIG. 10.

Figure 11:
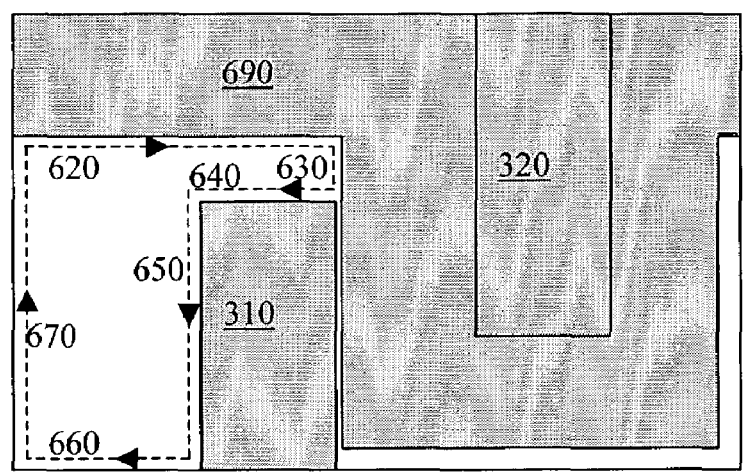

Another left edge walk may be performed to determine whether gcell 300 has any additional capacity. As shown in FIG. 11, the edge walk begins along edge 620, and continues along edges 630, 640, 650, 660, and 670. In this example, the edge walk returns to the beginning edge 610, which indicates that the gcell 300 has reached its full capacity.

Figure 12:
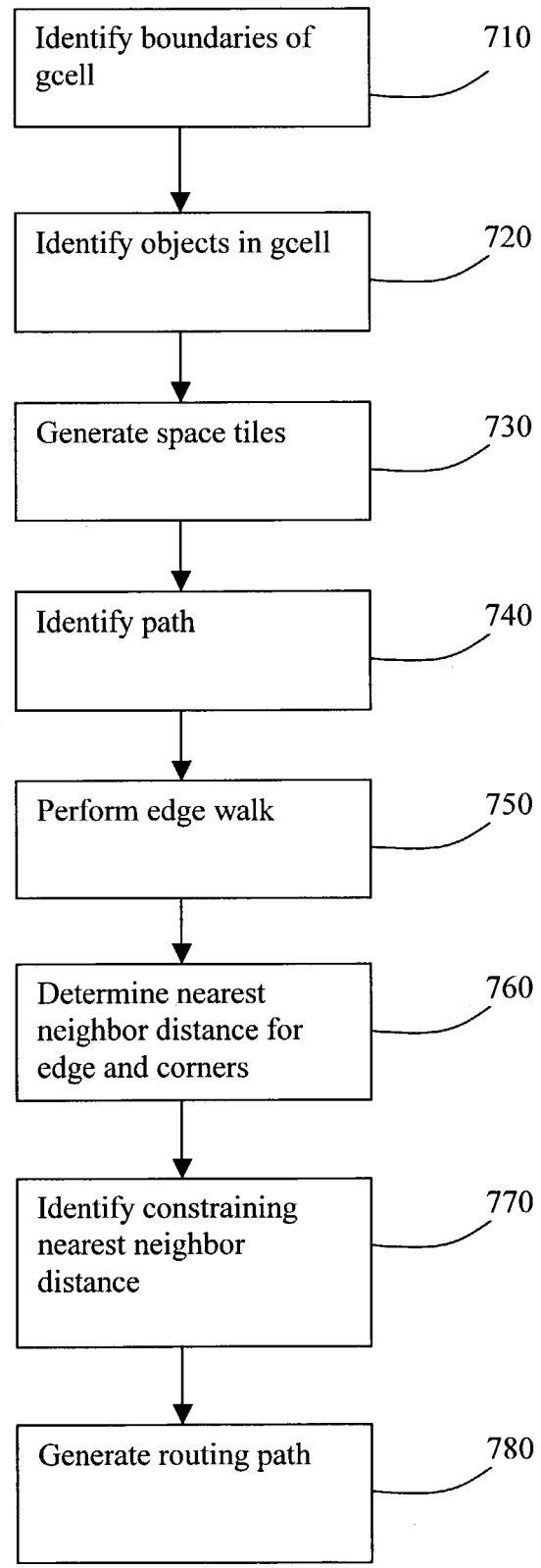
FIG. 12 depicts a flowchart of a process to perform an edge walk to make a maximum flow analysis according to an embodiment of the invention.

FIG. 12 shows a flowchart of an embodiment of a method of performing maximum flow analysis with an edge walk. Boundaries of a gcell are identified, 710. Objects within the gcell are identified, 720. Free space tiles and used space tiles are generated, 730. A path from a source node to a sink node through the free space tiles is identified, 740. A walk along the left edge of each free space tile in the path is performed, 750. For each left edge and corner in the path, the distance to the nearest neighbor from the left edge is determined, 760. The constraining nearest neighbor from the nearest neighbors to the edges and corners is identified, 770, for example by selecting the nearest neighbor having the smallest distance. A routing path along the left edge path that has a width equal to the distance of the selected nearest neighbor is generated, 780.

Therefore, what has been described are methods and mechanisms for performing maximum flow analysis. The present invention may be embodied as any combination of software, hardware, or manual operations. In one specific embodiment, the invention is embodied as a EDA software tool for placing and/or routing integrated circuit designs.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the exact ordering or content of the described process actions may be changed without affecting the scope or operation of the invention. The specification and drawings are, accordingly, to be regarded in an illustrative rather than restrictive sense.

What is claimed is:

1. A method of using space tiles to determine maximum flow through a gcell, comprising:
   identifying boundaries of a gcell;
   identifying objects within the gcell;
   generating used space tiles corresponding to space occupied by objects within the gcell;
   generating free space tiles corresponding to unoccupied space within the gcell;
   generating a directed graph based upon the free space tiles; and
   determining maximum flow through the gcell based upon analysis of the directed graph.

2. The method of claim 1 in which the act of determining the maximum flow is performed by identifying an edge of one of the space tiles having a minimum capacity.

3. The method of claim 1, wherein identifying objects further comprises:
   performing a search with zone trees within the boundaries of the gcell.

4. The method of claim 1, further comprising:
   identifying a routing path through the free space tiles.

5. The method of claim 4, wherein the routing path through the gcell begins at a source node outside of one boundary of the gcell and ends at a sink node outside another boundary of the gcell.

6. The method of claim 1, further comprising:
   determining a capacity of each edge along the path through the free space tiles.

7. The method of claim 6, further comprising:
   for each edge, comparing the capacity of the edge to a minimum capacity; and
   if the edge has a capacity that is less than the minimum capacity, then the capacity of that edge becomes the minimum capacity.

8. The method of claim 7, further comprising:
   identifying the minimum capacity as the maximum capacity of wires that may be routed through the gcell along the routing path through the free space tiles.

9. A system for using space tiles to determine maximum flow through a gcell, comprising:
   means for identifying boundaries of a gcell;
   means for identifying objects within the gcell;
   means for generating used space tiles corresponding to space occupied by objects within the gcell;
   means for generating free space tiles corresponding to unoccupied space within the gcell;
   means for generating a directed graph based upon the free space tiles; and
   means for determining maximum flow through the gcell based upon analysis of the directed graph.

10. The system of claim 9 in which the means for determining the maximum flow is performed by identifying an edge of one of the space tiles having a minimum capacity.

11. The system of claim 9, wherein the means for identifying objects further comprises:
   means for performing a search with zone trees within the boundaries of the gcell.

12. The system of claim 9, further comprising:
   means for identifying a routing path through the free space tiles.

13. The system of claim 12, wherein the means for the routing path through the gcell begins at a source node outside of one boundary of the gcell and ends at a sink node outside another boundary of the gcell.

14. The system of claim 9, further comprising:
   means for determining a capacity of each edge along the path through the free space tiles.

15. The system of claim 14, further comprising:
   means for comparing the capacity of the edge to a minimum capacity for each edge, and
   if the edge has a capacity that is less than the minimum capacity, then the capacity of that edge becomes the minimum capacity.

16. The system of claim 15, further comprising:
   means for identifying the minimum capacity as the maximum capacity of wires that may be routed through the gcell along the routing path through the free space tiles.

17. A computer program product comprising a computer usable medium having executable code to execute a process for using space tiles to determine maximum flow through a gcell, the process comprising:
   identifying boundaries of a gcell;
   identifying objects within the gcell;
   generating used space tiles corresponding to space occupied by objects within the gcell;
   generating free space tiles corresponding to unoccupied space within the gcell;
   generating a directed graph based upon the free space tiles; and
   determining maximum flow through the gcell based upon analysis of the directed graph.

18. The computer program product of claim 17 in which the act of determining the maximum flow is performed by identifying an edge of one of the space tiles having a minimum capacity.

19. The computer program product of claim 17, wherein identifying objects further comprises:
   performing a search with zone trees within the boundaries of the gcell.

20. The computer program product of claim 17, further comprising:
   identifying a routing path through the free space tiles.

21. The computer program product of claim 20, wherein the routing path through the gcell begins at a source node outside of one boundary of the gcell and ends at a sink node outside another boundary of the gcell.

22. The computer program product of claim 17, further comprising:
   determining a capacity of each edge along the path through the free space tiles.

23. The computer program product of claim 22, further comprising:
   for each edge, comparing the capacity of the edge to a minimum capacity; and
   if the edge has a capacity that is less than the minimum capacity, then the capacity of that edge becomes the minimum capacity.

24. The computer program product of claim 23, further comprising:
   identifying the minimum capacity as the maximum capacity of wires that may be routed through the gcell along the routing path through the free space tiles.

* * * * *